United States Patent
Guyot et al.

(10) Patent No.: US 10,243,583 B2
(45) Date of Patent: Mar. 26, 2019

(54) CPU ERROR REMEDIATION DURING ERASURE CODE ENCODING

(71) Applicant: Western Digital Technologies, Inc., San Jose, CA (US)

(72) Inventors: Cyril Guyot, San Jose, CA (US); Lluis Pamies-Juarez, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

(21) Appl. No.: 15/626,043

(22) Filed: Jun. 16, 2017

(65) Prior Publication Data
US 2018/0367162 A1  Dec. 20, 2018

(51) Int. Cl.
| | |
|---|---|
| H03M 13/09 | (2006.01) |
| G06F 11/10 | (2006.01) |
| H03M 13/15 | (2006.01) |
| H03M 13/00 | (2006.01) |

(52) U.S. Cl.
CPC ....... H03M 13/093 (2013.01); G06F 11/1004 (2013.01); H03M 13/154 (2013.01); H03M 13/616 (2013.01); H03M 13/617 (2013.01); H03M 13/6516 (2013.01)

(58) Field of Classification Search
CPC ............. H03M 13/093; H03M 13/154; H03M 13/616; H03M 13/617; H03M 13/6516; G06F 11/1004
See application file for complete search history.

(56) References Cited

U.S. PATENT DOCUMENTS

| | | |
|---|---|---|
| 5,539,756 A | 7/1996 | Glaise et al. |
| 6,952,797 B1 | 10/2005 | Kahn et al. |
| 7,114,116 B2 | 9/2006 | Byrd |
| 7,529,987 B2 | 5/2009 | Jochemsen et al. |
| 8,621,321 B2 | 12/2013 | Steiner et al. |
| 8,898,536 B2 | 11/2014 | Kogelnik |
| 2002/0144208 A1 | 10/2002 | Gallezot et al. |
| 2004/0153935 A1* | 8/2004 | Niesen ................. H04L 1/0057 714/746 |

(Continued)

OTHER PUBLICATIONS

Yen et al. "Simple Error Detection Methods for Hardware Implementation of Advanced Encryption Standard" dated Jun. 2006, 12 pages.

(Continued)

Primary Examiner — Kyle Vallecillo
(74) Attorney, Agent, or Firm — Patent Law Works LLP (57) ABSTRACT

Technology that detects computation errors is disclosed, in which a system may include one or more processors and storage logic. The storage logic may be executed by the one or more processors to perform operations comprising: receiving a data vector, the data vector including a plurality of ordered blocks; transposing the data vector into a set of sub vectors, each of the sub vectors including a corresponding data element from each of the ordered blocks; generating a set of discrete cyclic redundancy checks (CRCs) based on the set of sub vectors; transposing the set of discrete CRCs into a set of mixed CRCs, each of the mixed CRCs including a CRC data element from each of the discrete CRCs; and compacting the set of mixed CRCs into a reduced CRC.

20 Claims, 7 Drawing Sheets

(56) References Cited

U.S. PATENT DOCUMENTS

| | | | |
|---|---|---|---|
| 2004/0158794 A1* | 8/2004 | Niesen | H04L 1/0057 |
| | | | 714/758 |
| 2009/0125778 A1* | 5/2009 | Uchida | H04L 1/0057 |
| | | | 714/749 |
| 2011/0145683 A1* | 6/2011 | Gopal | G06F 9/30018 |
| | | | 714/781 |
| 2011/0231636 A1* | 9/2011 | Olson | H03M 13/158 |
| | | | 712/222 |
| 2014/0013181 A1 | 1/2014 | Fredrickson | |
| 2015/0234706 A1 | 8/2015 | Alrod et al. | |

OTHER PUBLICATIONS

Feng "Cyclic Redundancy Check: TMS320C64+ Implementation" dated Oct. 2006, 18 pages.
Wolf et al "Securing the Data Path of Next-Generation Router Systems" dated Nov. 30, 2009, 23 pages.
Unknown Author "Cyclic Redundancy Check" dated Mar. 8, 2017, 12 pages.

* cited by examiner

CPU ERROR REMEDIATION DURING ERASURE CODE ENCODING

BACKGROUND

The present disclosure relates to data encoding.

During the encoding of data to be stored using erasure codes, the computing system computing the parities associated with the encoded data can introduce errors that finally propagate to the storage medium and lie there undetected. Common errors that can typically be introduced into the data include system bus errors, internal bus errors, cache bit flip errors, and in-memory bit flips errors, although other errors are occur.

The errors that can arise in computer storage systems pose a threat to data durability and integrity because they can occur undetected, and as a result, produce data that is different from the original data to be stored.

Some existing systems can detect the above-described errors by erasure encoding the data over low order Galois fields, such as a 2-Galois Field (GF (2)), and applying cyclic redundancy check (CRC) operations on the erasure encoded data to verify that the data being stored is valid. More particularly, these existing systems use CRC algorithms that exploit the linearity property over low order Galois fields to detect errors (e.g., use coefficients equal to 1). This linearity property can be used to predict the CRC of the generated parities from the CRC of the input data using bitwise operations.

However, given the electronic and digital device technology, the amount of data that is being processed and stored is rapidly increasing, and so is the number of errors and the amount of processing that is required to verify the integrity of that data. The approaches used by these existing systems are not scalable at the same rate, and can lead to processing bottlenecks and high computing resource costs.

Even more, just using higher order Galois fields such as 256-Galois Field (GF (256)) in the place of a lower order Galois fields (e.g., (GF (2))) for the encoding and CRC generation process is inadequate to address the scaling issue because such higher order CRC functions, by themselves, do not exhibit the linearity property described above for CRCs over low order Galois fields, and as a result, are not amenable to bitwise operations (e.g., like XOR).

SUMMARY

The present disclosure relates to generating discrete cyclic redundancy check (CRC) for verifying the integrity of erasure-encoded data. According to one innovative aspect of the subject matter in this disclosure, a system comprises a plurality of storage devices, and a storage logic communicatively coupled to the plurality of storage devices. The storage logic is executable to receive a data vector having a plurality of ordered blocks. The storage logic is executable to transpose the data vector into a set of sub vectors, which is referred to as data columns in some cases. The storage logic is executable to generate a set of discrete CRCs based on the set of sub vectors, respectively. The discrete CRCs collectively form a CRC matrix with a plurality of CRC columns. The storage logic is executable to transpose the set of discrete CRCs associated with the CRC matrix into a set of mixed CRCs. The storage logic is further executable to compact the set of mixed CRCs into a reduced CRC which may be compared with a parity CRC associated with the data vector to verify the integrity of data vector.

In another innovative aspect, a method may comprise receiving a data vector, the data vector including a plurality of ordered blocks; transposing the data vector into a set of sub vectors, each of the sub vectors including a corresponding data element from each of the ordered blocks; generating a set of discrete CRCs based on the set of sub vectors, respectively; transposing the set of discrete CRCs into a set of mixed CRCs, each of the mixed CRCs including a CRC data element from each of the discrete CRCs; and compacting the set of mixed CRCs into a reduced CRC which may be compared with a parity CRC associated with the data vector to verify the integrity of data.

Other implementations of one or more of these aspects include corresponding systems, apparatus, and computer programs, configured to perform the actions of the methods, such aspects having the methods encoded on computer storage devices.

These and other implementations may optionally include one or more of the following features, such as, but not limited to: that the ordered blocks comprise a data row with a plurality of sequential columns respectively containing sequential data elements; that transposing the data row of each ordered block into a data column; that the data column has a plurality of sequential rows respectively containing the sequential data elements; that the data column of each of the ordered blocks collectively forms a transposed data matrix; that the transposed data matrix includes a plurality of mixed sequential rows; that each mixed sequential row of the plurality of mixed sequential rows includes a group of the first sequential rows at a corresponding tier; that the group of the first sequential rows includes the corresponding data element from each of the ordered blocks at the corresponding tier; that the set of sub vectors comprise a data matrix including a plurality of sequential rows; that each of the sequential rows includes a set of mixed data elements comprising the corresponding data element from each of the ordered blocks; that generating the set of discrete CRCs based on the set of sub vectors, respectively, comprises generating a discrete CRC for each sequential row of the sequential rows of the data matrix using the set of mixed data elements from the sequential row; that the discrete CRCs can be a CRC32c; that transposing the set of discrete CRCs into a set of mixed CRCs can comprise transposing 8 32-bit CRCs to a 32 byte data vector; that compacting the set of mixed CRCs into a reduced CRC can comprise applying a compacting function to the set of mixed CRCs to obtain the reduced CRC; that the compacting function can comprise a higher degree polynomial; that a higher degree polynomial can include a polynomial having four or more degrees; that the data vector can include an associated parity; that a parity CRC is generated using the associated parity; that the parity CRC can be compared to the reduced CRC; and that an error can be determined based on comparing the parity CRC to the reduced CRC.

The technology disclosed here is advantageous in a number of respects. For instance, in systems that use codes defined over a higher field (e.g., than GF(2)), such as code built over GF($2^8$), in which linear bitwise data verification operations (e.g., XOR of data CRCs) applicable to GF(2) no longer apply, the disclosed technology can more efficiently and reliably ensure that if computational error(s) occur during encoding of data, they can be detected without having to recode all of the data (which is computationally expensive). As a further example, the technology can advantageously provide linear CRC functions for codes defined over a higher field, such as a CRC function that has the property of f (p+a·d)=f(p)+a·f(d), where d is the data vector, p is the parity, and a is a coefficient greater than one (e.g., such as a spider code coefficient in GF ($2^8$)). This is beneficial as the technology can, in some applications, use existing efficient in-CPU instructions that compute CRCs, and thus maintain compatibility with existing central processing unit (CPU) architectures.

It should be understood, however, that the above list of features and advantages is not all-inclusive and many additional features and advantages are contemplated and fall within the scope of the present disclosure. Moreover, it should be understood that the language used in the present disclosure has been principally selected for readability and instructional purposes, and not to limit the scope of the subject matter disclosed herein.

DETAILED DESCRIPTION

The innovative technology disclosed herein includes various aspects, such as systems, methods, apparatuses, computer-readable media, computer program products, etc., for detecting errors in erasure-encoded data. By overcoming many of the inefficiencies experienced by previous systems, the aspects disclosed herein provide a variety of improvements over previous storage systems. By way of example, the innovative technology disclosed herein can more reliably guarantee that, if an error occurred anywhere during encoding, it can be detected after the fact without recoding the underlying data, which is generally complex and computationally expensive.

Figure 1:
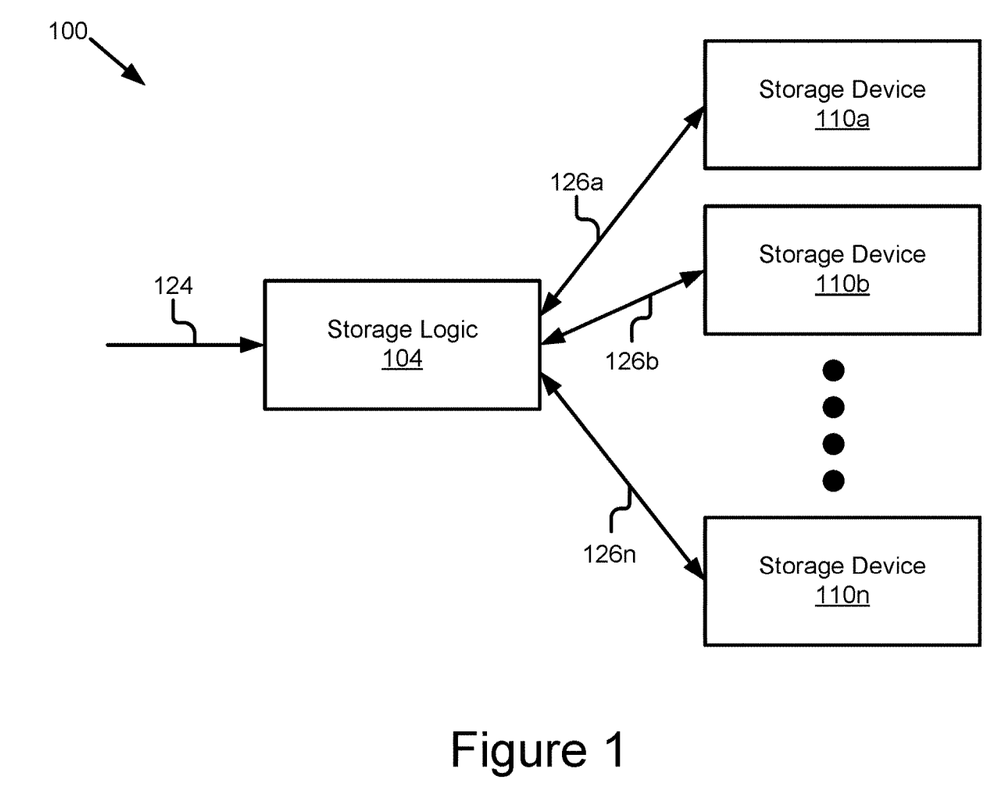
FIG. 1 is a block diagram of an example data storage system.
Figure 7:
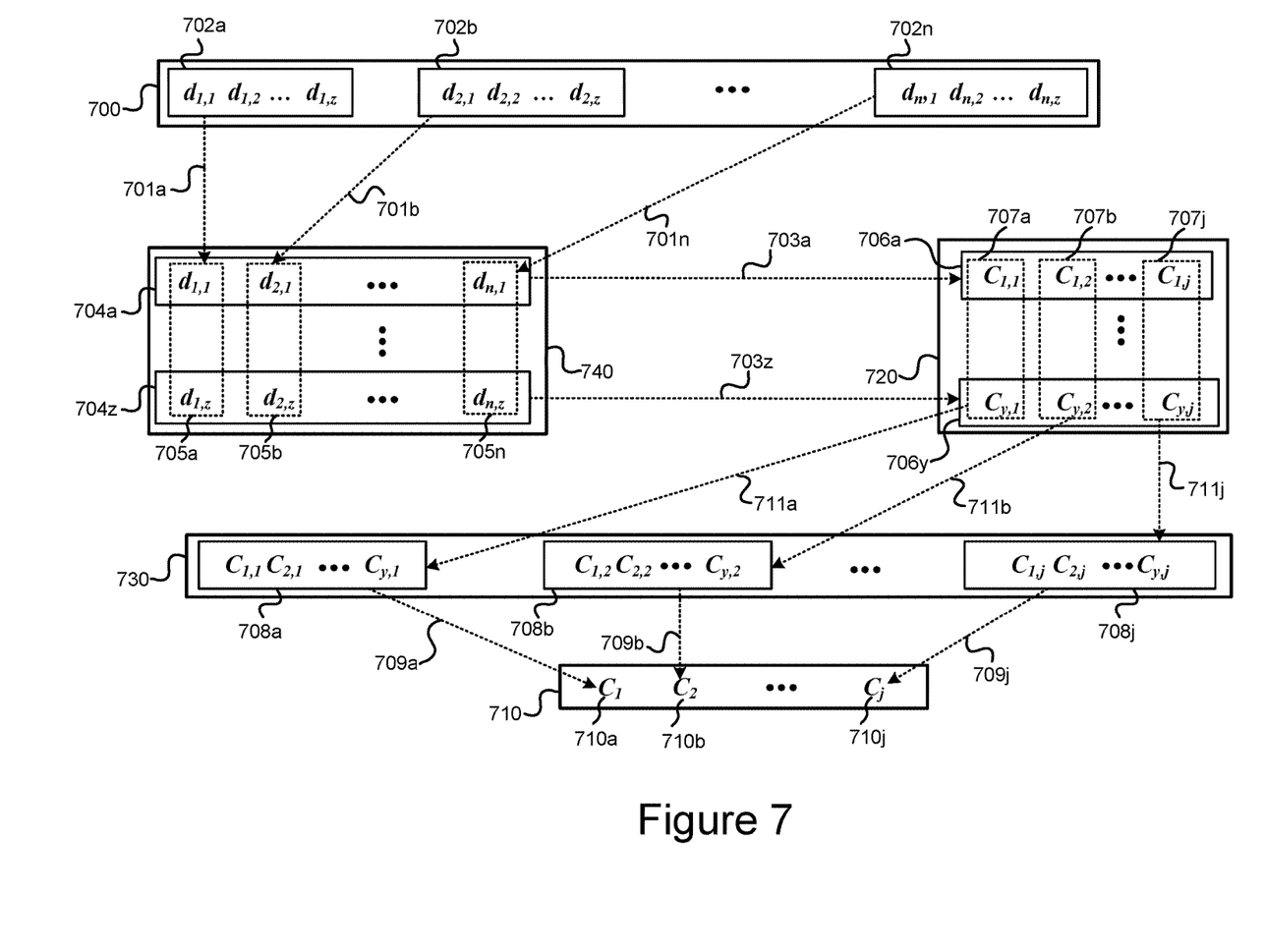
FIG. 7 is a dataflow diagram showing an example process for generating a reduced CRC from a data vector.

To further illustrate various advantages of the technology, the non-limiting embodiment depicted in FIG. 7 is now described, which makes reference to elements of FIGS. 1 and 2, which are described in detail elsewhere herein. In particular, FIG. 7 is a dataflow diagram showing an example process for generating a reduced cyclic redundancy check (CRC) from a data vector. A CRC is an error-detecting code used to detect inadvertent changes to data, which can be caused by a variety of factors as discussed elsewhere herein.

A data vector is a sequence of data elements, such as ordered data blocks. As shown in FIG. 7, in some embodiments, the data vector 700 may comprise the plurality of ordered blocks 702a, 702b, . . . 702n (also collectively or individually referred to as simply 702). An ordered block 702 is a data structure that includes a plurality of sequential data elements, such as but not limited to $d_{1,1}$, $d_{1,2}$, . . . $d_{1,z}$ included in ordered block 702a. The sequential data elements of an ordered block 702 collectively form a data row. Since the data elements are sequential, they can be regarded as belonging to sequential tiers. For instance, the first data element $d_{1,1}$ belongs to a first tier (tier 1), the second data element $d_{1,2}$ belongs to a second tier (tier 2), the zth data element $d_{1,z}$ belongs to a zth tier (tier z), and so forth.

The technology includes a system 200 that can process the data vector to produce the novel, compacted CRC, which it can use to more efficiently verify data. For instance, as discussed below with reference to FIG. 2A, the system 200 may include storage logic 104 comprising a data interface 211, a data transposer 212, and a CRC generator 213.

The data interface 211 can receive the data vector 700 and the data transposer 212 can transpose (701a, 701b, . . . 701n) the ordered blocks 702a, 702b, . . . 702n of the data vector 700 into a set of data columns 705a, 705b, . . . 705n (also collectively or individually referred to as simply 705). Each data column 705 includes the set of sequential data elements from the corresponding ordered block 702.

Once transposed, the sub vectors 705/data columns form a transposed data matrix 740 including a plurality of sub vectors, reflected as sequential rows 704a, . . . 704n. Each sequential row comprises a data element from each of the data columns (sub vectors 705). Since each sequential row includes a mixture of data elements from the data columns (one from each), it is sometimes referred to herein as a mixed sequential row. More particularly, each sequential row comprises data elements that belong to a corresponding tier. For instance, the first sequential row 704a includes data elements from a first tier of each ordered block 702 ($d_{1,1}$, $d_{2,1}$, . . . $d_{n,1}$); the second sequential row (not shown) includes data elements from the second tier of each ordered block 702 ($d_{1,2}$, $d_{2,2}$, . . . $d_{n,2}$); up to the zth sequential row 704z, which includes the data elements from the zth tier of each ordered block 702 ($d_{1,z}$, $d_{2,z}$, . . . $d_{n,z}$).

The CRC generator 213 can generate (703a, . . . 703z) discrete CRCs using the sequential rows of the data matrix 740. In generating discrete CRCs, the CRC generator performs a CRC operation on a given row of the data matrix and stores the results from the CRC operation in a corresponding row of a CRC matrix. As shown, the generated discrete CRC corresponding to row 704a of the data matrix is row 706a of the CRC matrix; the generated discrete CRC corresponding to row 704z of the data matrix is row 706y of the CRC matrix, and so forth. In some embodiments, the CRC generator 213 can perform the above-noted CRC operations by mapping data elements from each row of the data matrix 740 to corresponding CRCs that it generates and which form corresponding rows of the CRC matrix 720. In some instances, the CRC operations may be executed based on one or more CRC algorithms. A non-limiting example of a CRC algorithm includes CRC32c, although other suitable algorithms apply.

As shown, the CRC matrix 720 includes a plurality of columns 707a, 707b, . . . 707j (also collectively or individually referred to as simply 707). The plurality of columns of the CRC matrix 720 can be transposed (711a, 711b, . . . 711j) by the data transposer 212 into a set of mixed CRCs 730. The set of mixed CRCs 730 comprises CRC blocks 708a, 708b, . . . 708j (also collectively or individually referred to as simply 708). Each CRC block 708 includes CRC data elements from the columns 707 of the CRC matrix. For instance, CRC block 708a includes CRC elements $C_{1,1}$, $C_{2,1}$, . . . $C_{y,1}$ from column 707a of the CRC matrix 720; CRC block 708b includes CRC elements $C_{2,1}$, $C_{2,2}$, . . . $C_{y,2}$ from column 707b of the CRC matrix 720; CRC block 708j includes CRC elements $C_{1,j}$, $C_{2,j}$, . . . $C_{y,j}$ from column 707j of the CRC matrix 720, and so forth.

The CRC generator 213 can apply a compacting function (709*a*, 709*b*, . . . 709*j*) to the set of mixed CRCs 730 to obtain a reduced CRC 710. The reduced CRC has a plurality of reduced CRC elements 710*a*, . . . 710*j*. The compacting function can be applied (709*a*, 709*b*, . . . 709*j*) by the CRC generator 213 to CRC blocks 708*a*, . . . 708*j* to obtain the reduced CRC elements 710*a*, 710*b*, . . . 710*j*.

In some embodiments, applying a compacting function by the CRC generator 213 may involve dividing each CRC block of the set of mixed CRCs 708 by a higher degree polynomial to obtain the reduced CRC 710. A higher degree polynomial may include a polynomial having four or more degrees in some cases. An example higher degree polynomial by which each CRC block of the set of mixed CRCs can be divided is a degree-4 polynomial over 256-Galois field i.e. GF (256). As described elsewhere herein, the reduced CRC can be used to detect errors that can occur anywhere during operations, such as erasure code encoding, by comparing the reduced CRC with a parity CRC associated with the data vector 700.

FIG. 1 is a block diagram of an example storage system 100 capable of providing the storage and CRC-related acts, structure, and functionality described herein. In the depicted embodiment, the storage system 100 may include storage logic 104, and one or more storage devices 110*a*, 110*b*, . . . 110*n*. It should be noted that the terms "storage media" and the "storage device" may be used interchangeably throughout the present disclosure to refer to the physical media upon which the data is stored. The storage logic 104 and the one or more storage devices 110*a*, 110*b*, . . . 110*n* are communicatively coupled via signal lines 126*a*, 126*b*, . . . 126*n*. Further, in the illustrated embodiment, the storage logic 104 is further communicatively connected, via signal line 124, to other system 100 elements, such as internal and/or external systems, computer networks, remote system elements, etc. (not shown).

For example, the signal line 124 may represent a computer bus including a Serial Advanced Technology Attachment (SATA) bus, serial attached SCSI (SAS), peripheral component interconnect (PCI), PCI express (PCIe), or any other suitable type of internal and/or external communication bus for transferring data between components of a computing and/or storage device and/or between components of disparate components. As a further example, the computer bus may be communicatively connected to a host bus of a computer system. It should be recognized that the storage logic block may represent a distributed architecture or otherwise include multiple storage logic 104 elements. For simplicity and ease of understanding, the system configuration and operations performed by the storage system 100 are described in the context of a single storage logic 104, although it should be understood that the storage logic 104 may be of multiple components coupled for communication. Further, multiple installations including an instance of the storage logic 104 and a set of one or more storage device(s) 110 may be included in a system 100. Various other suitable configurations are also possible and contemplated.

However, the present disclosure is not limited to this configuration and a variety of different system environments and configurations can be deployed and are within the scope of the present disclosure. Other embodiments may include additional or fewer components.

For convenience, in the figures, an indication of a letter after a reference number or numeral, for example, "110*a*" may be a specific reference to the element or component that is designated by that particular reference numeral, while a reference numeral that appears in the text without a letter following it, for example, "110," may be a general reference to different embodiments of the element or component bearing that general reference numeral.

In some embodiments, the storage logic 104 may implement erasure coding, parity checking, CRC generation, read, write, update, delete, garbage collection, and other storage-related operations in association with the storage devices 110. The storage logic 104 can provide computing functionalities, services, and/or resources to send, receive, read, write, and transform data from other entities of system 100.

In some embodiments, the storage logic 104 can be comprised of hardware and/or software logic configured to perform the acts and/or functionality described herein. The storage logic 104 is coupled to the storage devices 110*a*, 110*b*, . . . 110*n* via signal lines 126*a*, 126*b*, . . . 126*n* for communication and cooperation with the storage devices 110*a*, 110*b*, . . . 110*n* of the storage system 100.

In some embodiments, the storage logic 104 can include additional components, which are not shown in FIG. 1 to simplify the drawing. Also, in some embodiments, not all of the components shown may be present. Further, the various controllers, blocks, and interfaces can be implemented in any suitable fashion. For example, a storage logic 104 can take the form of one or more of, for example, a microprocessor or processor and a computer-readable medium that stores computer-readable program code (e.g., software or firmware) executable by the (micro)processor, logic gates, switches, an application specific integrated circuit (ASIC), a programmable logic controller, an embedded microcontroller, etc., as discussed elsewhere herein. For instance, with reference to FIG. 2A, the storage logic may include instructions stored in the memory 104 and/or the CPU cache 210; may include hardware (e.g., including and/or not including firmware) coupled to the bus 230 for communication with the processor 202, memory 204, and/or other components, etc.; and/or may comprise hardware (e.g., including and/or not including firmware) coupled to and/or incorporated into the computation unit 205; and/or be implemented in another suitable form.

The storage devices 110 include non-transitory computer-usable (e.g., readable, writeable, etc.) media, which can be any non-transitory apparatus or devices that can contain, store, communicate, propagate or transport instructions, data, computer programs, software, code routines, etc., for processing by or in connection with a processor. While, in various embodiments, the storage devices 110 are described as including solid-state memory (e.g., flash), it should be understood that in some embodiments, the storage devices 110 may include other non-volatile memory devices with suitable characteristics, HDDs, hybrid storage devices, etc. Further example storage devices may include a dynamic random access memory (DRAM) device, a static random access memory (SRAM) device, magnetic tape, optical disk-based storage, or some other non-volatile storage device.

In some cases, storage logic 104 and/or the storage device(s) 110 may be integrated into a single storage device. In further cases, storage logic 104 may be implemented as a controller, such as a RAID controller, and storage devices 110 may include multiple devices connected to the controller. In some cases, a storage system 100 may be a distributed storage system spanning several geographic regions. For instance, the storage logic 104 may include an Application Programming Interface (API) implemented on one or more server nodes in the distributed storage system 100. Thus, control line 124 may reflect a transport protocol operating over Internet Protocol (IP). In such an example, the storage device(s) 110 may include several other server nodes spread across several geographic regions, and control lines 126 may also include a transfer protocol operating over IP, although other protocols for transferring data are also contemplated.

Figure 2A:
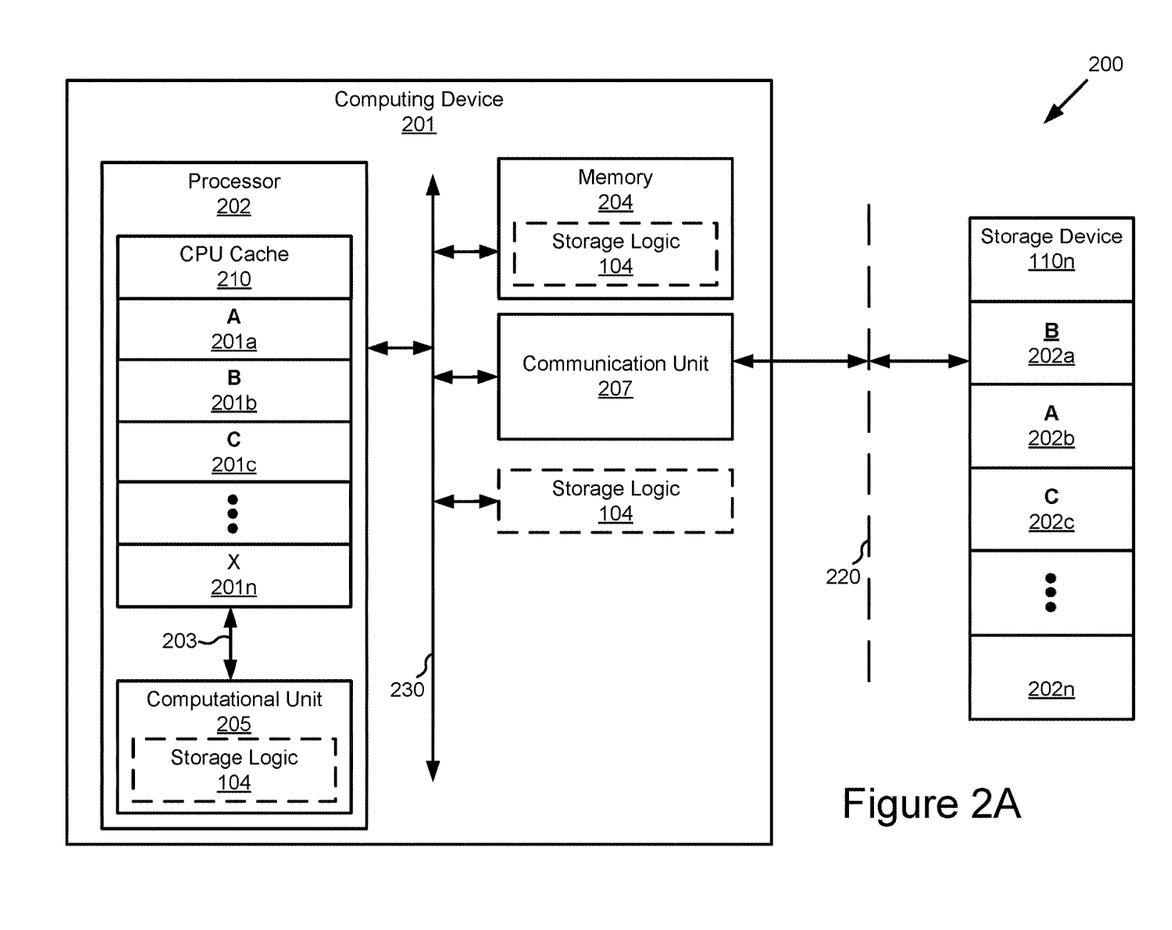
FIG. 2A illustrates an example system for processing data.

FIG. 2A illustrates an example system for processing data. The system 200 comprises a computing device 201 communicatively coupled to one or more storage devices 110 via data bus 220.

The computing device 201 may comprise a processor 202 communicatively coupled via data bus 230 to a memory 204, a communication unit 207, and/or other components (not shown). As shown, the processor may comprise a CPU cache 210 with a plurality of temporary storage locations 201a, 201b, 201c, ... 201n, which is coupled to a computational unit 205 via the data bus 203. Computational unit 205 can retrieve data from the CPU cache 210, perform operation(s) on the data based on instruction(s) from the storage logic 104, and store the result(s) from the operation(s) back into the CPU cache 210. In some embodiments, the computational unit 205 can execute erasure code encoding by retrieving data from the CPU cache 210 via the data bus 203, encoding the data based on an erasure code encoding algorithm, and storing the encoded data back into CPU cache 210.

The storage logic 104 can comprise various sub-components executable by the computational unit 205 to cause the computation unit 205 to perform various operations. For example, as shown in FIG. 2C, the storage logic 104 may include a data interface 211, a data transposer 212, and a CRC generator 213. The data interface 211 includes software and/or hardware logic for retrieving from and/or storing data in one or more locations including the CPU cache 210, the memory 204 and/or storage devices 110, as described elsewhere herein. The data transposer 212 includes software and/or hardware logic for transposing data as described elsewhere herein. The CRC generator 213 includes software and/or hardware logic for generating CRCs as described elsewhere herein.

Data can be communicated between the memory 204 and the CPU cache 210 via the data bus 230 of the computing device 201. Additionally, data can also be communicated between the storage device 110n and the CPU cache 210 via the communication unit 207 communicatively coupled to data buses 220 and 230.

While a particular processor 202 configuration is described in FIG. 2A, it should be understood that other processor 202 configurations are also encompassed by this disclosure. For instance, the processor 202 may include any processor having one or more arithmetic logic units, microprocessors, general-purpose controllers, or some other processor arrays to perform computations and provide electronic display signals to a display device. In some embodiments, the processor 202 includes a hardware processor having one or more processing cores. The processor 202 is coupled to the bus 230 for communication with the other components. Processor 202 processes data signals and may include various computing architectures including a complex instruction set computer (CISC) architecture, a reduced instruction set computer (RISC) architecture, or an architecture implementing a combination of instruction sets. Although only a single block is shown for the processor 202 in the example of FIG. 2A, multiple processors and/or processing cores may comprise the processor 202.

The memory 204 and/or CPU cache 210 may store instructions and/or data that may be executed by a customized processor (e.g., the processor 202). The memory 204 and/or CPU cache 210 are coupled for communication with the other components of the computing device 201. The instructions and/or data stored in the memory 204 and/or CPU cache 210 may include code for performing the techniques described herein. In some embodiments, the memory 204 and/or the CPU cache 210 may store instructions embodying the storage logic 104 or portions thereof.

The memory 204 and/or CPU cache 210 may include one or more non-transitory computer-usable (e.g., readable, writeable, etc.) media, which can include any non-transitory apparatus or device that can contain, store, communicate, propagate or transport instructions, data, computer programs, software, code, routines, etc., for processing by or in connection with the processor 202. For example, non-transitory memory may include, but is not limited to, dynamic random access memory (DRAM) device, static random access memory (SRAM) device, or another volatile or non-volatile memory device.

The buses 220 and/or 230 may include a communication bus for transferring data between components of a computing device or between computing devices, a network bus system, a processor mesh, SATA, SCSI, SAS, PCI, PCIe, and/or or any other suitable type of internal and/or external communication bus for transferring data between components of a computing and/or storage device and/or between components of disparate components. In some embodiments, the computing devices (e.g., client(s), server, etc.) and the storage logic 104 may cooperate and communicate via a software communication mechanism implemented in association with the buses 220 and/or 230. The software communication mechanism may include and/or facilitate, for example, inter-process communication, local function or procedure calls, remote procedure calls, network-based communication, secure communication, etc.

The communication unit 207 may include one or more interface devices for wired and wireless connectivity with a computer network to which the computing device 201 (e.g., which may embody the storage logic 104) may be coupled, such as client devices 106, servers, data sources, data storage devices 110, etc. For instance, the communication unit 207 may include, but is not limited to, CAT-type interfaces; wireless transceivers for sending and receiving signals using Wi-Fi™; Bluetooth®, cellular communications, etc.; bus interfaces; USB interfaces; proprietary connection types; various combinations thereof; etc. In some embodiments, the communication unit 207 can link the processor 202 to a network, which may in turn be coupled to other processing systems. The communication unit 207 can provide other connections to the network and to other entities of the system 100 using various standard communication protocols, including, for example, those discussed elsewhere, herein.

The computing device 201 may include further components in various embodiments, such as one or more of a graphics processor; a high-resolution touchscreen; a physical keyboard; forward and rear facing cameras; a Bluetooth® module; memory storing applicable firmware; and/or various physical connection interfaces (e.g., HDMI, headset jack, etc.); etc. Additionally, an operating system for managing the hardware and resources of the computing device 201, application programming interfaces (APIs) for providing applications access to the hardware and resources, a user interface module (not shown) for generating and displaying interfaces for user interaction and input, and applications including, for example, applications for manipulating documents, images, e-mail(s), and applications for web browsing, etc., may be stored and operable on the computing device 201.

As discussed in the Background, during data processing, computing system errors can in some cases occur, which can introduce unintentional errors into the data to be stored in the storage device 110. For example, during the process of communicating data between the computational unit 205 and the CPU cache 210 via the data bus 203 (see FIG. 2A), signal and/or other errors can corrupt and/or change the data.

Figure 2B:
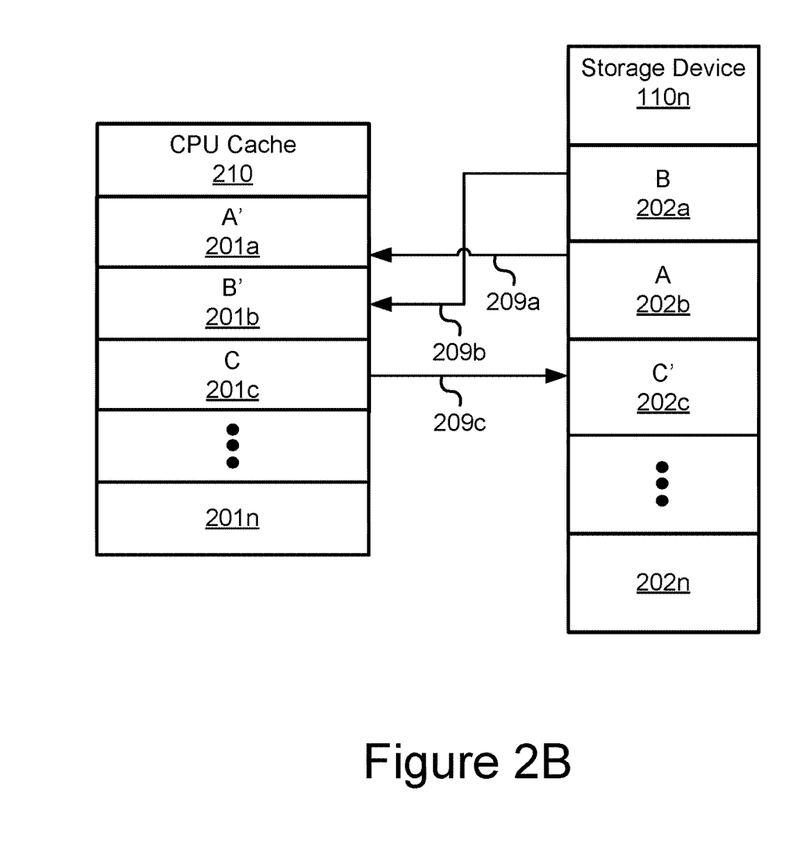
FIG. 2B illustrates an example data communication between a CPU cache and a storage device.
Figure 2C:
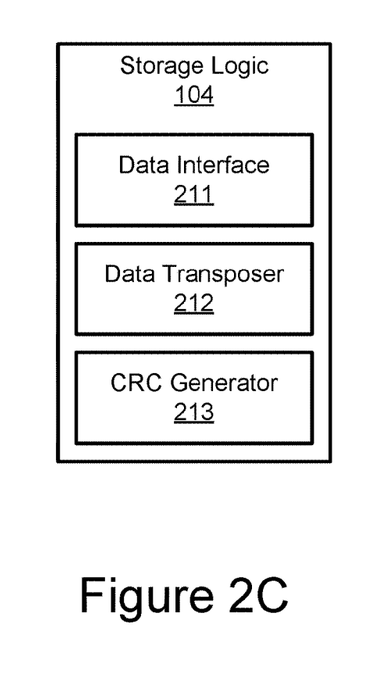
FIG. 2C illustrates example storage logic.

In further examples, errors may occur during the storage process, as illustrated by FIG. 2B. As shown, the CPU cache 210 may include a plurality of storage locations (referenced as 201a, 201b, 201c, . . . , 201n), and the storage device 110n may include a plurality of storage locations (202a, 202b, 202c, . . . 202n). The computational unit 205 may communicate data between the CPU cache 210 locations and the storage device 110 locations. For instance, signal lines 209a, 209b, . . . 209n may represent data communicated via data buses 220 and 230, and/or the communication unit 207.

During communication of the data between the cache 210 and/or storage devices 110 (e.g., 110n), errors, such as in-memory bit flip errors, can be introduced into the data prior to storage in the intended repository (e.g., 201a, 201b, 202c, etc.). More particularly, the CPU cache 210 can receive data from locations 202a and 202b of the storage device 110n, as shown by signal lines 209a and 209b, and provide data for storage to location 202c, as shown by signal line 209c. For instance, when retrieving data B from the location 202a, and storing it as B' in location 201b; retrieving data A from the location 202b, and storing it as A' in location 201a; and/or retrieving data C from the location 201c, and storing it as C' in location 202c, errors may be introduced. These errors are also applicable to the memory 204 and/or other components, as noted elsewhere herein.

Figure 3:
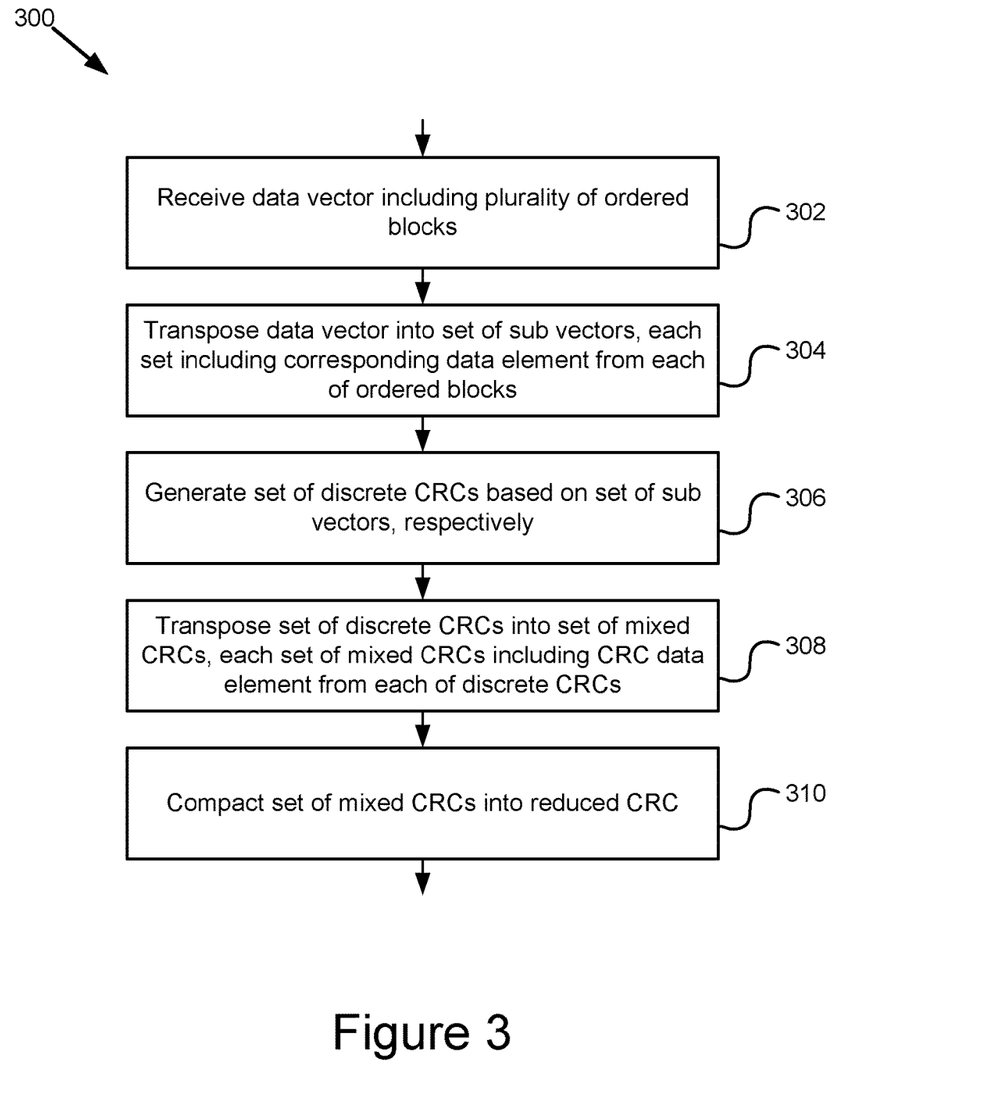
FIG. 3 is flowchart of an example method for generating a reduced CRC from a data vector.

FIG. 3 is an example method 300 for generating a reduced CRC from a data vector. In block 302, the data interface 211 can receive a data vector having a plurality of ordered blocks. The data transposer 212 at 304 can transpose the received data vector into a set of sub vectors. A sub vector may include corresponding data elements from each of the ordered blocks.

In some embodiments, the ordered block may be represented as a data row. The data transposer 212 may transpose the data row into a data column. A data column may contain the sequential data elements from the ordered block from which it was transposed. The data columns transposed from the ordered blocks may collectively form a transposed data matrix, which arranges the data columns adjacently such that the data elements of data columns correspond by tier. Each sequential row of the transposed data matrix may comprise a sub vector and include a group of data elements.

Figure 4:
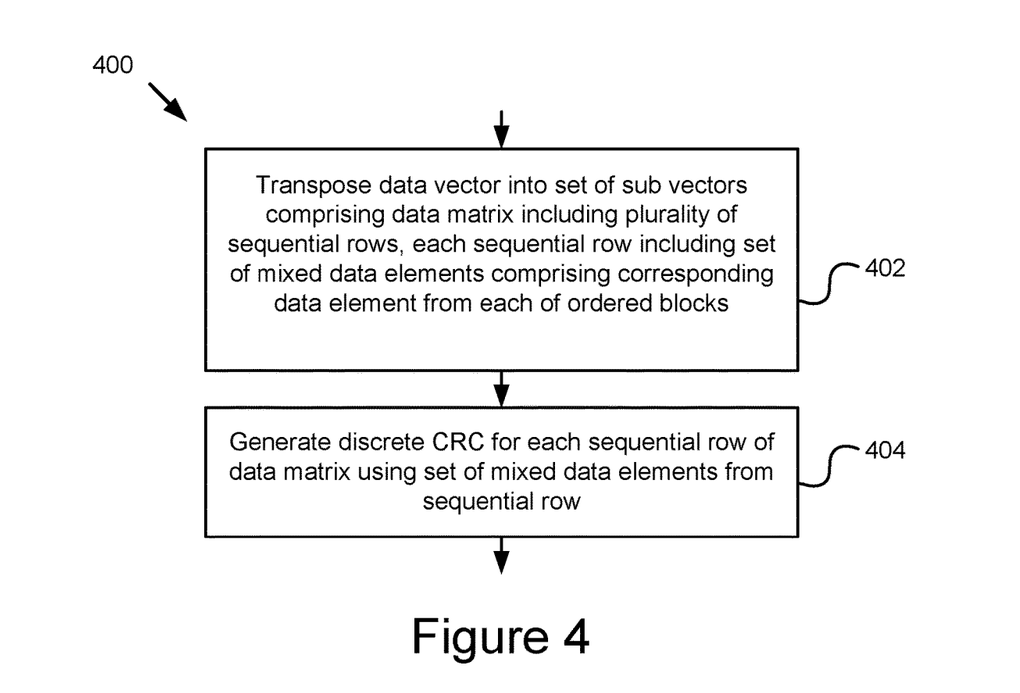
FIG. 4 is flowchart of an example method for generating discrete CRCs using sequential rows of a data matrix.

FIG. 4 depicts a further example of the operation(s) 400 that may be performed in block 304. At block 402 in particular, the data transposer 212 can transpose a data vector, which has a plurality of ordered blocks, into a set of sub vectors. The set of sub vectors may comprise a plurality of sequential rows forming a data matrix. Each sequential row of the plurality of sequential rows of the data matrix includes a set of mixed data elements comprising corresponding data elements from each of the ordered blocks.

As a further example referencing FIG. 7, the data vector (e.g., 700) may comprise a matrix of rows (e.g., 702) and the data transposer 212 may transpose the rows to columns (e.g., 705). These columns may form a derivative matrix (e.g., 740) whose rows (e.g., 704) include data from each column (e.g., 705). The data elements in each row (e.g., sub vector) comprise a mixture of elements across the data columns at a corresponding tier, and thus may be ordered based on the order of the data columns. For example, the first sequential row may include the first data element from each of the data columns (the first tier), the second sequential from may include the second data element from each of the data columns (the second tier), and so forth.

Referring back to FIG. 3, at block 306, the CRC generator 213 can generate a set of discrete CRCs based on the set of sub vectors, respectively. In some embodiments, the discrete CRCs may correspond to the rows of the data matrix formed from the columns transposed from the data vector. For example, as shown in block 404 of the method 400 in FIG. 4, the CRC generator 213 may generate a discrete CRC for each sequential row of the data matrix. In some embodiments, the CRC generator 213 may generate a given discrete CRC using the mixed data elements (e.g., $d_{1,1}, d_{2,1}, \ldots d_{n,1}$) from a corresponding row (e.g., 704a) of the data matrix. The CRC generator 213 may use any suitable CRC algorithm to generate the CRC. A non-limiting example may include CRC32c, although other variations are also possible and encompassed hereby.

Continuing at block 308 of FIG. 3, the data transposer 212 can transpose the set of discrete CRCs into a set of mixed CRCs. Each set of mixed CRCs includes a CRC data element from each of the discrete CRCs. In some embodiments, the data transposer 212 may transpose the set of discrete CRCs into the set of mixed CRCs by transposing a column (e.g., 707a) of the CRC matrix into a row (e.g., 708a) of the set of mixed CRCs. In a non-limiting example, the data transposer 212 may transpose the set of mixed CRCs by transposing 8 32-bit CRCs to a 32 byte data vector, although other variations are also possible and encompassed hereby. In this non-limiting case, the CRC matrix would comprise 32 columns, each column having 8-bits.

At block 310 of FIG. 3, the CRC generator 213 may compact the set of mixed CRCs into a reduced CRC at block 310 using a compacting function. In some embodiments, the compacting function may comprise a higher degree polynomial, although lower degree polynomials may also be used in alternate embodiments. As used herein, a higher degree polynomial is a polynomial having four or more degrees and a lower degree polynomial is a polynomial having a degree less than four. An example higher degree polynomial may be $x^4+x+1$ whereas a lower degree polynomial may be $x^2$. In some cases, the higher degree polynomial is selected to be usable over GF2 for computational efficiency.

In various embodiments, the data transposition operations described herein, such as those described with reference to FIG. 7 and relative to the methods 300 and 400 (e.g., block 304, block 308, block 402 etc.) can be performed efficiently on the processor 202, such as using Single instruction, multiple data (SIMD) instructions, although other suitable variations are also possible and contemplated. Additionally or alternatively, in various embodiments, the CRC operations described herein may be advantageously performed using existing in-processor CRC logic, as discussed elsewhere herein. Doing so can beneficially provide a comparatively efficient process for higher order encoding with CRCs to that of lower order encoding with CRCs using existing computational hardware.

Figure 5:
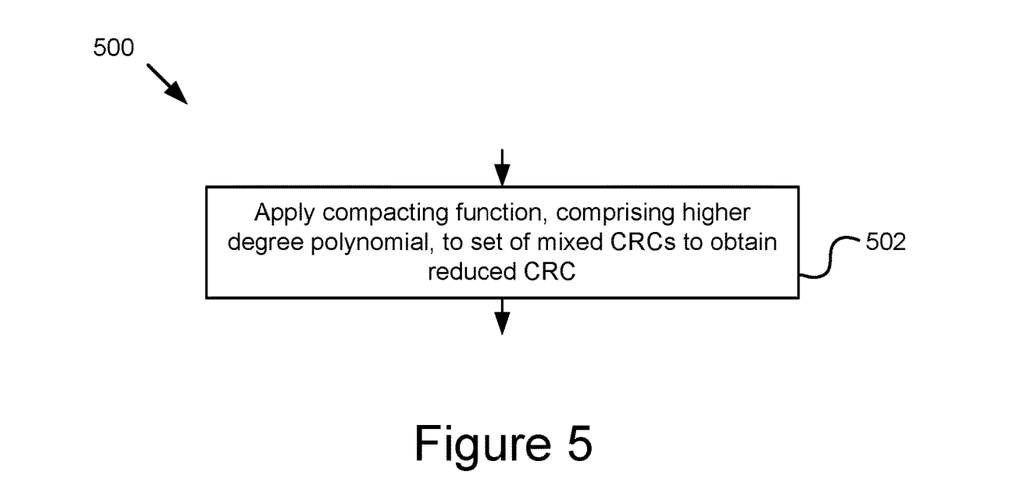
FIG. 5 is flowchart of an example method for obtaining a reduced CRC.

FIG. 5 illustrates a further example of the operation(s) 500 that may be performed in block 310 of FIG. 3. At block 502 in particular, the CRC generator 213 can apply a compacting function comprising a higher degree polynomial to the set of mixed CRCs to obtain the reduced CRC. In some embodiments, the CRC generator 213 may apply the compacting function to CRC blocks (e.g., 708a, 708b, . . . 708j) comprising the set of mixed CRCs to obtain the reduced CRC (e.g., 710).

Figure 6:
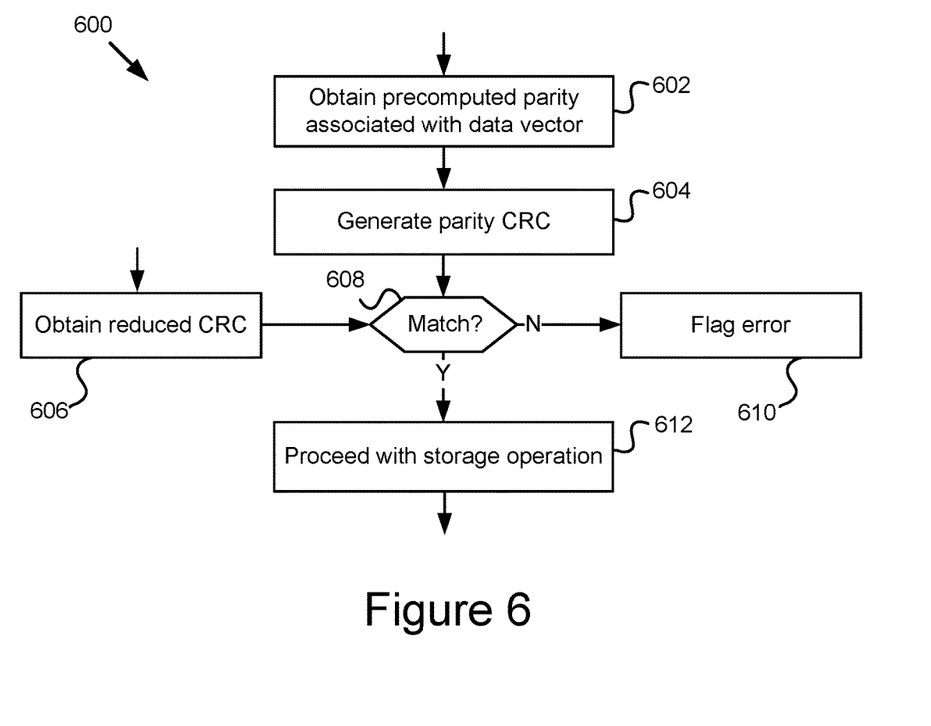
FIG. 6 is flowchart of an example method for comparing a reduced CRC to a parity CRC.

FIG. 6 shows an example method 600 for comparing a reduced CRC to a parity CRC. In block 602, the data interface 211 can obtain a precomputed parity associated with a data vector. In some embodiments, the CRC generator 212 can generate the precomputed parity from the data vector as part of generating erasure-encoded data. For example, the CRC generator 212 can generate the parity using multiple operations that may have a linearity property, although other variations are also possible and encompassed hereby. In a non-limiting example, the multiple operations may include a mathematical operation such as $-p=p+a*d$, where p represents a precomputed parity, a represents a scalar value/coefficient, and d represents a data vector. In some embodiments, the scalar value a is equal to 1. In some embodiments, the scalar value may be greater than 1 or have a higher order.

In block 604 of the method 600, the CRC generator 212 can generate a parity CRC using the precomputed parity. In some embodiments, the CRC generator may generate the parity CRC based on one or more CRC algorithms. A non-limiting example of a CRC algorithm includes CRC32c, although other suitable algorithms apply.

Continuing at block 606 of the method 600, the data interface 211 can obtain a reduced CRC associated with a data vector and compare in block 608 the reduced CRC with a parity CRC to determine a match. In some embodiments, the comparison made by the data interface 211 can be used to predict the parity CRC. For instance, the data interface can determine whether the reduced CRC matches the parity CRC (i.e. a match indicates an accurate prediction of the parity CRC) in order to validate the integrity of the data vector from which the reduced CRC was derived. In some cases, the parity CRC is associated with the data vector to which the reduced CRC is also associated. Thus, if the data interface 211 determines in block 608 that the reduced CRC does not match the parity CRC, the data interface can flag an error at block 610. However, if the data interface determines that the parity CRC matches the reduced CRC, the data interface 211 can proceed with a storage operation at block 612. For instance, responsive to determining at block 608 by the data interface 211 that the parity CRC matches the reduced CRC, the data interface 211 can store the data vector in the storage device 110n, although it should be understood that data interface 211 can also store the data vector in other storage locations such as data stores, flash drives, or other suitable storage media.

The method 600 improves existing systems in a number of ways. In some embodiments, when the data interface compares 608 the reduced CRC to the parity CRC, the result from this comparison could indicate that the processed data is error free. For instance, when a computing system erasure encodes a data vector, the computing device 201 may use the method 600 to determine whether errors were introduced at any stage during the encoding process before proceeding to store the encoded data vector. For instance, a data interface associated with the computing device 201 may compare a reduced CRC associated with the encoded data vector and compare the reduced CRC with a parity CRC associated with the encoded data vector. If the data interface 211 determines that the reduced CRC associated with the encoded data vector matches the parity CRC associated with the encoded data vector, the data interface can proceed to store the encoded data vector. However, if the data vector determines that the reduced CRC associated with the encoded data does not match the parity CRC associated with the encoded data vector, the data interface 211 can flag an error. As discussed elsewhere herein, the error can any applicable error that arises during computational processing and/or data transmissions, such as system bus errors, internal bus errors, cache bit flip errors, in-memory bit flip errors, and/or other system errors can also be introduced into the encoded data vector.

In the above description, for purposes of explanation, numerous specific details were set forth. It will be apparent, however, that the disclosed technologies can be practiced without any given subset of these specific details. In other instances, structures and devices are shown in block diagram form. For example, the disclosed technologies are described in some implementations above with reference to user interfaces and particular hardware. Moreover, the technologies disclosed above primarily in the context of on line services; however, the disclosed technologies apply to other data sources and other data types (e.g., collections of other resources for example images, audio, web pages).

Reference in the specification to "one implementation" or "an implementation" means that a particular feature, structure, or characteristic described in connection with the implementation is included in at least one implementation of the disclosed technologies. The appearances of the phrase "in one implementation" in various places in the specification are not necessarily all referring to the same implementation.

Some portions of the detailed descriptions above were presented in terms of processes and symbolic representations of operations on data bits within a computer memory. A process can generally be considered a self-consistent sequence of steps leading to a result. The steps may involve physical manipulations of physical quantities. These quantities take the form of electrical or magnetic signals capable of being stored, transferred, combined, compared, and otherwise manipulated. These signals may be referred to as being in the form of bits, values, elements, symbols, characters, terms, numbers or the like.

These and similar terms can be associated with the appropriate physical quantities and can be considered labels applied to these quantities. Unless specifically stated otherwise as apparent from the prior discussion, it is appreciated that throughout the description, discussions utilizing terms for example "processing" or "computing" or "calculating" or "determining" or "displaying" or the like, may refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The disclosed technologies may also relate to an apparatus for performing the operations herein. This apparatus may be specially constructed for the required purposes, or it may include a general-purpose computer selectively activated or reconfigured by a computer program stored in the computer. Such a computer program may be stored in a computer readable storage medium, for example, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory or any type of media suitable for storing electronic instructions, each coupled to a computer system bus.

The disclosed technologies can take the form of an entirely hardware implementation, an entirely software implementation or an implementation containing both hardware and software elements. In some implementations, the technology is implemented in software, which includes but is not limited to firmware, resident software, microcode, etc.

Furthermore, the disclosed technologies can take the form of a computer program product accessible from a non-transitory computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computing system or data processing system suitable for storing and/or executing program code will include at least one processor (e.g., a hardware processor) coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems and Ethernet cards are just a few of the currently available types of network adapters.

Finally, the processes and displays presented herein may not be inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the disclosed technologies were not described with reference to any particular programming language. It will be appreciated that a variety of programming languages may be used to implement the teachings of the technologies as described herein.

The foregoing description of the implementations of the present techniques and technologies has been presented for the purposes of illustration and description. It is not intended to be exhaustive or to limit the present techniques and technologies to the precise form disclosed. Many modifications and variations are possible in light of the above teaching. It is intended that the scope of the present techniques and technologies be limited not by this detailed description. The present techniques and technologies may be implemented in other specific forms without departing from the spirit or essential characteristics thereof. Likewise, the particular naming and division of the modules, routines, features, attributes, methodologies and other aspects are not mandatory or significant, and the mechanisms that implement the present techniques and technologies or its features may have different names, divisions and/or formats. Furthermore, the modules, routines, features, attributes, methodologies and other aspects of the present technology can be implemented as software, hardware, firmware or any combination of the three. Also, wherever a component, an example of which is a module, is implemented as software, the component can be implemented as a standalone program, as part of a larger program, as a plurality of separate programs, as a statically or dynamically linked library, as a kernel loadable module, as a device driver, and/or in every and any other way known now or in the future in computer programming. Additionally, the present techniques and technologies are in no way limited to implementation in any specific programming language, or for any specific operating system or environment. Accordingly, the disclosure of the present techniques and technologies is intended to be illustrative, but not limiting.

What is claimed is:

1. A system comprising:
one or more processors; and
storage logic that, when executed by the one or more processors, performs operations comprising:
   receiving a data vector, the data vector including a plurality of ordered blocks;
   transposing the data vector into a set of sub vectors, each of the sub vectors including a corresponding data element from each of the plurality of ordered blocks;
   generating a set of discrete cyclic redundancy checks (CRCs) based on the set of sub vectors;
   transposing the set of discrete CRCs into a set of mixed CRCs, each of the mixed CRCs including a CRC data element from each of the discrete CRCs; and
   compacting the set of mixed CRCs into a reduced CRC.

2. The system of claim 1, wherein each of the plurality of ordered blocks comprises a data row including sequential data elements.

3. The system of claim 2, wherein:
transposing the data vector into a set of sub vectors comprises transposing the data row of each ordered block into a data column;
the data column contains the sequential data elements from the data row of the ordered block;
the data column of each of the ordered blocks collectively forms a transposed data matrix;
the transposed data matrix includes a plurality of mixed sequential rows;
each mixed sequential row of the plurality of mixed sequential rows includes a group of ordered data elements at a corresponding tier; and
the group of ordered data elements includes the corresponding data element from each of the ordered blocks at the corresponding tier.

4. The system of claim 1, wherein:
the set of sub vectors comprises a data matrix including a plurality of sequential rows;
each of the sequential rows includes a set of mixed data elements comprising the corresponding data element from each of the ordered blocks; and
generating the set of discrete CRCs based on the set of sub vectors comprises:
   generating a discrete CRC for each sequential row of the sequential rows of the data matrix using the set of mixed data elements from the sequential row.

5. The system of claim 1, wherein transposing the set of discrete CRCs into a set of mixed CRCs comprises transposing 8 32-bit CRCs to a 32-byte data vector.

6. The system of claim 1, wherein compacting the set of mixed CRCs into a reduced CRC comprises:

applying a compacting function to the set of mixed CRCs to obtain the reduced CRC, the compacting function comprising a higher degree polynomial.

7. The system of claim 1, wherein:
the data vector includes an associated precomputed parity; and
the operations further comprise:
generating a parity CRC for the associated precomputed parity;
performing a comparison between the parity CRC and the reduced CRC; and
determining an error in the data vector based on the comparison.

8. A computer-implemented method for detecting computation errors, the computer-implemented method comprising:
receiving a data vector, the data vector including a plurality of ordered blocks;
transposing the data vector into a set of sub vectors, each of the sub vectors including a corresponding data element from each of the ordered blocks;
generating a set of discrete cyclic redundancy checks (CRCs) based on the set of sub vectors;
transposing the set of discrete CRCs into a set of mixed CRCs, each of the mixed CRCs including a CRC data element from each of the discrete CRCs; and
compacting the set of mixed CRCs into a reduced CRC.

9. The computer-implemented method of claim 8, wherein each of the ordered blocks comprises a data row with a plurality of sequential columns respectively containing sequential data elements.

10. The computer-implemented method of claim 9, wherein:
transposing the data vector into a set of sub vectors comprises transposing the data row of each ordered block into a data column;
the data column contains the sequential data elements from the data row of the ordered block;
the data column of each of the ordered blocks collectively forms a transposed data matrix;
the transposed data matrix includes a plurality of mixed sequential rows;
each mixed sequential row of the plurality of mixed sequential rows includes a group of ordered data elements at a corresponding tier; and
the group of ordered data elements includes the corresponding data element from each of the ordered blocks at the corresponding tier.

11. The computer-implemented method of claim 8, wherein:
the set of sub vectors comprises a data matrix including a plurality of sequential rows;
each of the sequential rows includes a set of mixed data elements comprising the corresponding data element from each of the ordered blocks; and
generating the set of discrete CRCs based on the set of sub vectors comprises:
generating a discrete CRC for each sequential row of the sequential rows of the data matrix using the set of mixed data elements from the sequential row.

12. The computer-implemented method of claim 11, wherein the discrete CRC is a CRC32c.

13. The computer-implemented method of claim 8, wherein transposing the set of discrete CRCs into a set of mixed CRCs comprises transposing 8 32-bit CRCs to a 32-byte data vector.

14. The computer-implemented method of claim 8, wherein compacting the set of mixed CRCs into a reduced CRC comprises:
applying a compacting function to the set of mixed CRCs to obtain the reduced CRC, the compacting function comprising a higher degree polynomial.

15. The computer-implemented method of claim 8, wherein the data vector includes an associated precomputed parity, and the method further comprises:
generating a parity CRC for the associated precomputed parity.

16. The computer-implemented method of claim 15, further comprising:
performing a comparison between the parity CRC and the reduced CRC; and
determining an error in the data vector based on the comparison.

17. A system comprising:
one or more processors; and
a storage logic in memory executable by the one or more processors, the storage logic comprising:
means for receiving a data vector, the data vector including a plurality of ordered blocks;
means for transposing the data vector into a set of sub vectors, each of the sub vectors including a corresponding data element from each of the ordered blocks;
means for generating a set of discrete cyclic redundancy checks (CRCs) based on the set of sub vectors;
means for transposing the set of discrete CRCs into a set of mixed CRCs, each of the mixed CRCs including a CRC data element from each of the discrete CRCs; and
means for compacting the set of mixed CRCs into a reduced CRC.

18. The system of claim 1, wherein the operations further comprise verifying integrity of the data vector using the reduced CRC.

19. The computer-implemented method of claim 8, further comprising verifying integrity of the data vector using the reduced CRC.

20. The system of claim 17, wherein the storage logic further comprises means for verifying integrity of the data vector using the reduced CRC.

* * * * *